(12) United States Patent
Ho et al.

(10) Patent No.: US 10,932,358 B2
(45) Date of Patent: Feb. 23, 2021

(54) SEMICONDUCTOR DEVICES AND METHODS FOR ENHANCING SIGNAL INTEGRITY OF AN INTERFACE PROVIDED BY A SEMICONDUCTOR DEVICE

(71) Applicant: MEDIATEK INC., Hsin-Chu (TW)

(72) Inventors: Duen-Yi Ho, Hsinchu (TW); Hung-Chuan Chen, Hsinchu (TW); Shang-Pin Chen, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/114,669

(22) Filed: Aug. 28, 2018

(65) Prior Publication Data

US 2019/0098747 A1 Mar. 28, 2019

Related U.S. Application Data

(60) Provisional application No. 62/563,777, filed on Sep. 27, 2017.

(51) Int. Cl.
*H05K 1/02* (2006.01)
*H01L 23/00* (2006.01)
*H01L 23/498* (2006.01)
*G06F 13/40* (2006.01)
(Continued)

(52) U.S. Cl.
CPC ....... *H05K 1/0218* (2013.01); *G06F 13/4072* (2013.01); *H01L 23/49838* (2013.01); *H01L 23/5386* (2013.01); *H01L 24/09* (2013.01); *H05K 1/0243* (2013.01); *H01L 23/50* (2013.01); *H01L 2924/1436* (2013.01); *H01L 2924/151* (2013.01); *H05K 2201/10159* (2013.01)

(58) Field of Classification Search
CPC .............. H05K 1/0218; H05K 1/0243; H05K 2201/10159; H01L 23/5386; H01L 23/49838; H01L 24/09; H01L 23/50; H01L 2924/151; H01L 2924/1436; H01L 23/5286; H01L 23/552; H01L 23/528; H01L 23/66; G06F 13/4072
See application file for complete search history.

(56) References Cited

U.S. PATENT DOCUMENTS 9,674,941 B2 6/2017 Chang et al.
9,812,187 B2 11/2017 Chen et al.
9,978,692 B2 5/2018 Chang et al.
(Continued)

FOREIGN PATENT DOCUMENTS

CN 103298241 A 9/2013
CN 105873353 A 8/2016
(Continued)

*Primary Examiner* — Marcos D. Pizarro
*Assistant Examiner* — Sue Tang
(74) *Attorney, Agent, or Firm* — Wolf, Greenfield & Sacks, P.C.

(57) ABSTRACT

A semiconductor device includes a substrate, a die and multiple conductive traces. The die is mounted on the substrate. The conductive traces are routed on the substrate and connected to the die. The conductive traces at least include a plurality of first conductive traces and a plurality of second conductive traces. The second conductive traces are coupled to a predetermined voltage for providing a shielding pattern. The first conductive traces and the second conductive traces are disposed on the substrate in a substantially interlaced pattern.

18 Claims, 8 Drawing Sheets

(51) Int. Cl.
    *H01L 23/538*    (2006.01)
    *H01L 23/50*     (2006.01)

(56) References Cited

U.S. PATENT DOCUMENTS

| | | | | |
|---|---|---|---|---|
| 2002/0018396 A1* | 2/2002 | Morita | .................. | G11C 7/1045 |
| | | | | 365/233.11 |
| 2007/0040626 A1 | 2/2007 | Blair et al. | | |
| 2008/0237848 A1* | 10/2008 | Yoshikawa | .............. | G11C 5/02 |
| | | | | 257/723 |
| 2010/0295860 A1* | 11/2010 | Somerville | .......... | G09G 3/3216 |
| | | | | 345/545 |
| 2013/0220690 A1 | 8/2013 | Chang et al. | | |
| 2016/0233174 A1* | 8/2016 | Chang | .................. | H01L 23/552 |
| 2017/0125363 A1 | 5/2017 | Chang et al. | | |

FOREIGN PATENT DOCUMENTS

| | | |
|---|---|---|
| CN | 107024873 A | 8/2017 |
| EP | 3 057 133 A2 | 8/2016 |
| EP | 3 200 569 A1 | 8/2017 |
| TW | 201701736 A | 1/2017 |
| TW | 201732796 A | 9/2017 |

\* cited by examiner

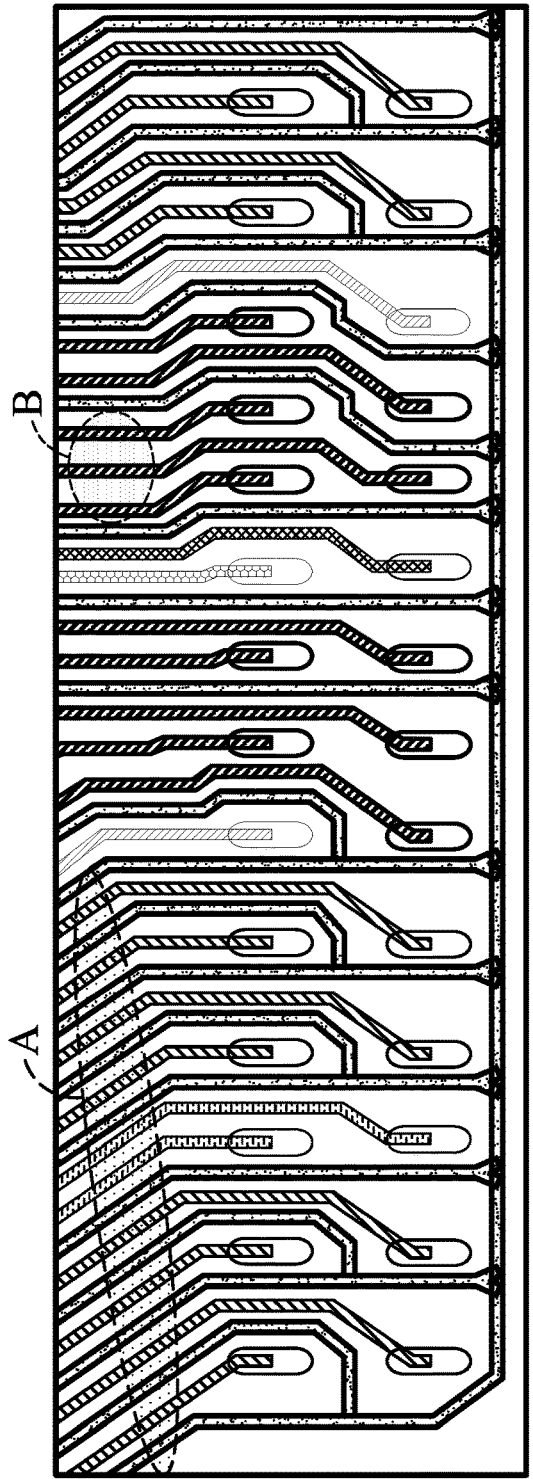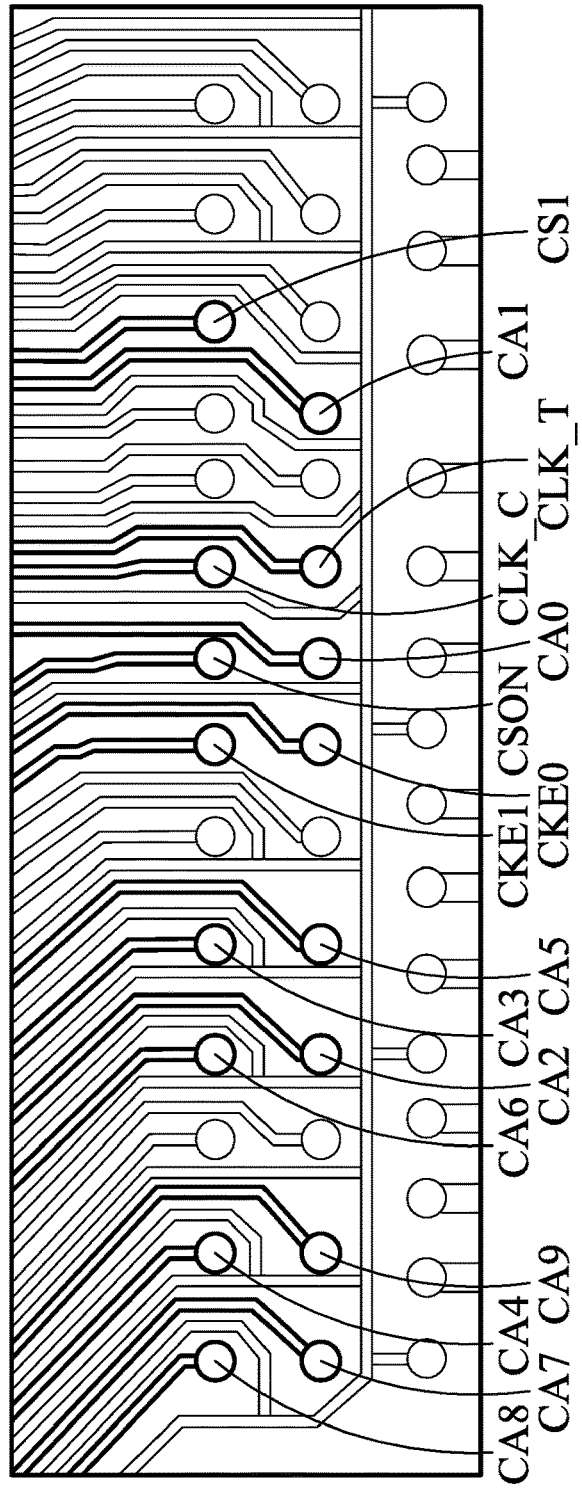
FIG. 5A
FIG. 5B

SEMICONDUCTOR DEVICES AND METHODS FOR ENHANCING SIGNAL INTEGRITY OF AN INTERFACE PROVIDED BY A SEMICONDUCTOR DEVICE

CROSS REFERENCE TO RELATED APPLICATIONS

This application claims the benefit of U.S. Provisional Application No. 62/563,777 filed Sep. 27, 2017 and entitled "A novel pad sequence arrangement in LP3 & LP4 combo design for performance enhancement", the entire contents of which are hereby incorporated by reference.

BACKGROUND OF THE INVENTION

Field of the Invention

The invention relates to a semiconductor device, and more particularly to a semiconductor device with a novel arrangement of the conductive traces for enhancing transmission performance and signal integrity.

Description of the Related Art

In electronic devices, printed circuit boards (PCBs) are used to mechanically support and electrically connect electronic components using conductive pathways, conductive traces (e.g. signal traces or ground traces) etched from metal sheets laminated onto a non-conductive core substrate. In recent years, an increasing amount of input/output (I/O) connections for multi-functional chips or memory chips have been required in semiconductor chip package design. The impact of this will be pressure on printed circuit board (PCB) fabricators to minimize the width and the space of the conductive traces, or increase the number of layers on the PCB. The conductive traces used to transmit the signals corresponding to the same function need to be arranged and configured in the same manner on the PCB. For example, the conductive traces used to transmit the address/data bus of a memory need to be arranged and configured in parallel, and the spaces between the conductive traces are also small. However, the adjacent conductive traces on the PCB can result in a crosstalk or an undesired coupling problem, especially in high speed applications. Thus, the crosstalk or coupling problem can detrimentally affect the quality of a signal traveling on a conductive trace, thereby affecting the signal reception of the electronic component supported by the PCB.

Therefore, it is desirable to optimize the arrangement of the conductive traces for avoiding the crosstalk or coupling problem of a semiconductor device.

BRIEF SUMMARY OF THE INVENTION

Semiconductor devices and methods for enhancing signal integrity of an interface provided by a semiconductor device are provided. An exemplary embodiment of a semiconductor device comprises a substrate, a die and multiple conductive traces. The die is mounted on the substrate. The conductive traces are routed on the substrate and connected to the die. The conductive traces at least comprise a plurality of first conductive traces and a plurality of second conductive traces. The second conductive traces are coupled to a predetermined voltage for providing a shielding pattern. The first conductive traces and the second conductive traces are disposed on the substrate in a substantially interlaced pattern.

An exemplary embodiment of a method for enhancing signal integrity of an interface provided by a semiconductor device capable of controlling access operations of accessing to at least two types of external device via the interface comprises: providing a die on a substrate of the semiconductor device, wherein the die is capable of operating in at least a first mode and a second mode according to the type of the external device; providing a plurality of first conductive traces and a plurality of second conductive traces to be connected to the die, wherein the second conductive traces are coupled to a predetermined voltage for providing a shielding pattern; interlacing arrangements of the first conductive traces and the second conductive traces, wherein the first conductive traces and the second conductive traces are interlaced with each other; and coupling the first conductive traces and the second conductive traces to corresponding pads of the die.

Another exemplary embodiment of semiconductor device comprises a substrate, a die and multiple conductive traces. The die is mounted on the substrate. The conductive traces are routed on the substrate and connected to the die. The conductive traces are configured to provide an interface for interfacing with an external device and the die is capable of operating in at least a first mode and a second mode according to a type of the external device coupled thereto. The conductive traces at least comprise a plurality of first conductive traces. When the die is configured to operate in the first mode, the first conductive traces are configured to perform bidirectional signal transmission, and when the die is configured to operate in the second mode, the first conductive traces are configured to perform unidirectional signal transmission.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 5A is an exemplary diagram showing the layout of a portion of conductive traces of a memory interface according to an embodiment of the invention;

FIG. 5B is an exemplary diagram showing the layout of a portion of conductive traces of a memory interface with the corresponding pad arrangement according to an embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
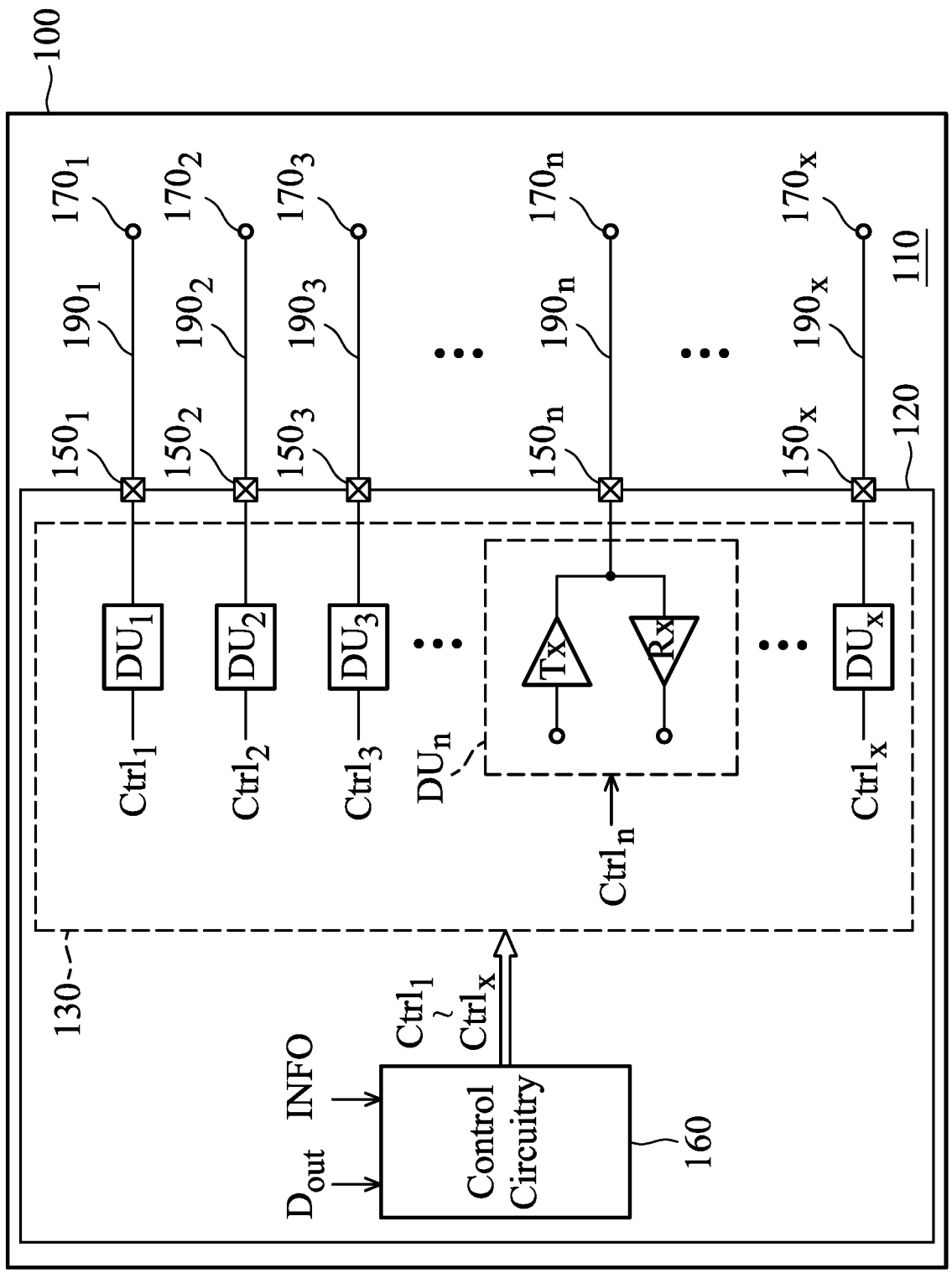
FIG. 1 shows an exemplary semiconductor device 100 according to an embodiment of the invention.

FIG. 1 shows an exemplary semiconductor device 100 according to an embodiment of the invention. The semiconductor device 100 comprises a substrate 110, a die 120 mounted on the substrate 110 and a plurality of conductive traces $190_1$-$190_x$ routed on the substrate 110 and connected to the die 120 via the corresponding pads $150_1$-$150_x$, wherein x is a positive integer. According to an embodiment of the invention, the conductive traces $190_1$-$190_x$ (accompanying with the corresponding pads $150_1$-$150_x$) are configured to provide an interface for interfacing with an external device (not shown), which can be coupled to the corresponding pads $150_1$-$150_x$ of the die 120 via the solder ball $170_1$-$170_x$. The die 120 may be a controller device for controlling access to the external device. According to an embodiment of the invention, the die 120 may be a combo design that is capable of supporting control operations of different types or different generations of external device. In one embodiment, the die 120 may be a memory controller capable of accessing different types or different generations of memory devices coupled thereto. Therefore, in the embodiments of the invention, the die 120 is capable of operating in at least a first mode and a second mode according to the type of external device coupled thereto, and the semiconductor device 100 is capable of supporting controls of access operations to at least two types of external device via the interface.

According to an embodiment of the invention, the die 120 may at least comprise a driving module 130, a control circuitry 160 and a plurality of pads $150_1$-$150_x$. The control circuitry 160 receives data $D_{out}$ to be provided to the external device and indication signal INFO for indicating information regarding the type of external device, and provides a plurality of control signals $Ctrl_1$-$Ctrl_x$ to the driving module 130 according to the data $D_{out}$ and the indication signal INFO. In some embodiments, the data $D_{out}$ and the indication signal INFO are obtained from a circuit (e.g. a memory, a register, a processor or other functional circuitry) of the die 120 or a device outside of the die 120.

According to an embodiment of the invention, some pads of the die 120 is capable of supporting both bidirectional signal transmission and unidirectional signal transmission. The driving module 130 may comprise a plurality of driving units $DU_1$-$DU_x$ coupled to the corresponding pad of the die 120. For example, the driving unit DU' is coupled to the pad $150_1$, the driving unit $DU_2$ is coupled to the pad $150_2$, and so on. In the embodiment, one or more of the driving units $DU_1$-$DU_x$ may have the same circuitry and structure. Using the driving unit $DU_n$ as an example, the driving unit $DU_n$ may comprise a transmitter driving circuit TX for driving the signal to be output by the corresponding pad $150n$ and a receiver driving circuit RX for driving the signal received from the corresponding pad $150n$.

Figure 2:
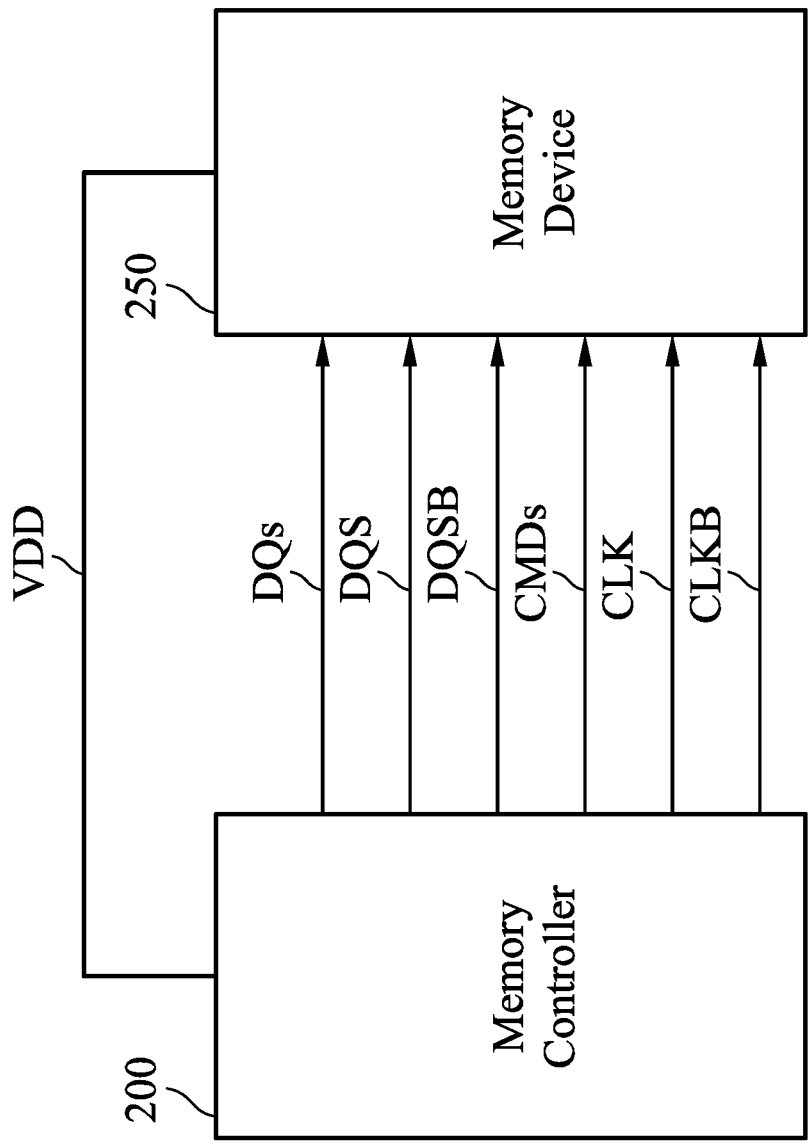
FIG. 2 is an exemplary block diagram showing the interface provided between a memory controller and a memory device according to an embodiment of the invention.

FIG. 2 is an exemplary block diagram showing the interface provided between a memory controller and a memory device according to an embodiment of the invention. The memory controller 200 may be implemented by the die 120 (the semiconductor device 100) after being packaged. The memory device 250 may be a Dynamic Random Access Memory (DRAM) device, such as a low power double data rate type III (LPDDR3) memory, a low power double data rate type IV (LPDDR4) memory, a (double data rate) (DDR) memory, or any other subsequent product. In the embodiments of the invention, the memory controller 200 is a combo design that is capable of controlling access operations of accessing to at least two of the LPDDR3, the LPDDR4 and the DDR memory devices, or any other combination of compatible memory devices.

Besides the power supply VDD, the memory interface provided between the memory controller 200 and the memory device 250 may comprise clock, data and command signal transmission pathways. For example, the data bus DQ may be utilized to transmit 11 bits of signals, including 8 bits of data signal DQs, 2 strobe signals DQS and DQSB and 1 mask signal DQM (not shown in FIG. 2). The command bus CMD may be utilized to transmit multiple bits of command signals CMDs, wherein the number of bits required for each command may vary depending on the type of memory device. The clock bus may be utilized to transmit a pair of complementary clock signals CLK and CLKB.

Figure 3A:
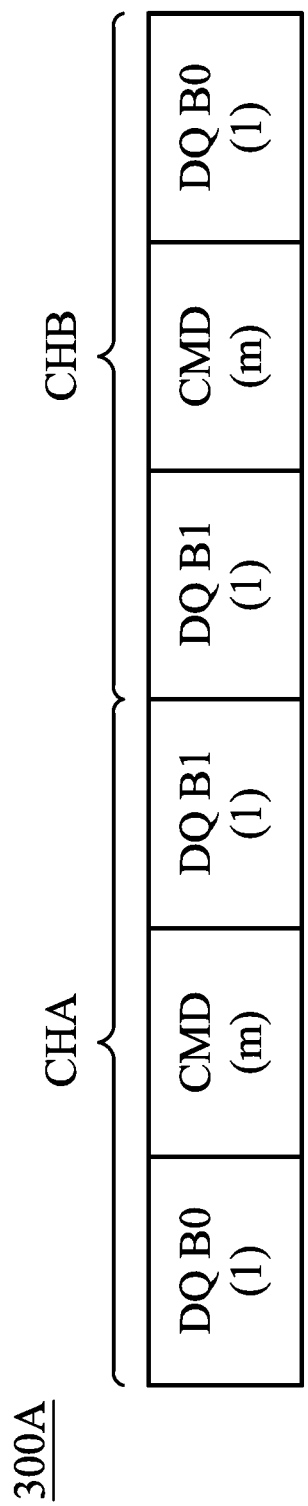
FIG. 3A is a schematic diagram showing an exemplary pad arrangement of the interface provided by proposed semiconductor device according to an embodiment of the invention.

FIG. 3A is a schematic diagram showing an exemplary pad arrangement of the interface provided by proposed semiconductor device according to an embodiment of the invention. The pad arrangement 300A is suitable for an external device having a relatively high data transmission rate, such as a LPDDR4. According to an embodiment of the invention, the interface may comprise two channels CHA and CHB. Each channel is configured to transmit two bytes of data (B0 and B1) and multiple bits of commands. According to an embodiment of the invention, the pads for connecting to the command bus CMD is disposed between the pads for connecting to the data buses DQ. In FIG. 3A, the trace arrangements of the interface are also shown, wherein (1) and (m) respectively represent different trace arrangements. For enhancing signal integrity of the interface provided by proposed semiconductor device, the shielding traces are interleaved with the signal traces utilized to transmit data signals (which will be discussed in more detailed in the following paragraphs). For example, in the trace arrangement labeled (1), signal traces are separated by shielding traces. One shielding trace is disposed adjacent to one signal trace to provide a shielding pattern, so as to achieve a better shielding effect. In the trace arrangement labeled (m), one shielding trace may be disposed adjacent to m signal traces to provide a shielding pattern, wherein m is a positive integer and greater than 1. Therefore, in the embodiment of the invention, when the pitches are fixed (that is, the pitches or distances between each two adjacent or two closest conductive traces (e.g. the shielding trace or the signal trace) are fixed), the shielding traces in the trace arrangement labeled (1) are arranged denser than in the trace arrangements labeled (m).

Figure 3B:
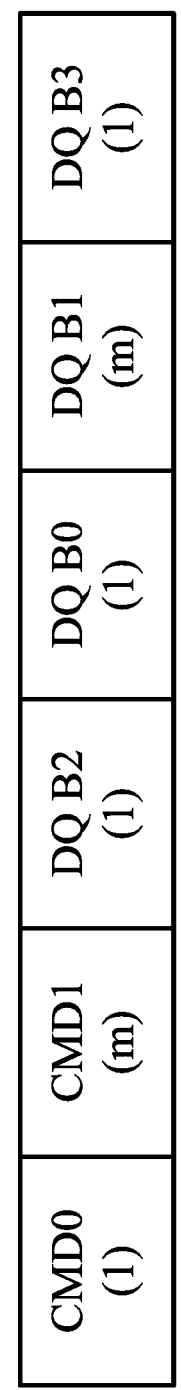
FIG. 3B is a schematic diagram showing another exemplary pad arrangement of the interface provided by proposed semiconductor device according to an embodiment of the invention.

FIG. 3B is a schematic diagram showing another exemplary pad arrangement of the interface provided by proposed semiconductor device according to an embodiment of the invention. The pad arrangement 300B is suitable for an external device having a normal data transmission rate, such as a LPDDR3. According to an embodiment of the invention, the interface is configured to transmit four bytes of data (B0, B1, B2 and B3) and multiple bits of commands. According to an embodiment of the invention, the two command buses (CMD 0 and CMD 1) are disposed adjacent to each other and are not separated by the data buses DQ. Since the proposed semiconductor device is a combo design capable of supporting different types of external device, such as the LPDDR3 and LPDDR4 in this embodiment, the arrangement of the conductive traces routed on the substrate are fixed and shared by different types of external device. Thus, the sequence of the trace arrangements (1) and (m) in FIG. 3B is the same as in FIG. 3A.

It should be noted that although the sequence of the trace arrangements shown in FIG. 3A and FIG. 3B is (1) (m) (1) (1) (m) (1), the invention should not be limited thereto. Based on the concept of the invention, for enhancing transmission performance and signal integrity of the data signals that will be transmitted in high data transmission rate, the trace arrangement (1) is preferably configured for the pads that will be connected to the data bus DQ for data transmission, especially for high speed data transmission. Regarding this, in actual design, the sequence of the trace arrangements can be different from what is shown in FIG. 3A and FIG. 3B, and the sequence of trace arrangements may vary as the pad arrangement changes. Therefore, the sequence of the trace arrangements shown in FIG. 3A and FIG. 3B is merely an example among a variety of possible implementations and is merely provided for illustration, and the invention should not be limited thereto.

According to an embodiment of the invention, the conductive traces of the semiconductor device 100 may at least comprise a plurality of signal traces configured to transmit data signals (the first conductive traces) and a plurality of shielding traces (the second conductive traces). The shielding traces are coupled to a predetermined voltage for providing a shielding pattern. As discussed above, for different buses, the trace arrangement may be different. For example, for a portion of buses or regions on the substrate, the signal traces (the first conductive traces) and the shielding traces (the second conductive traces) are disposed on the substrate in a substantially interlaced pattern. The trace arrangement labeled (1) as discussed above is one exemplary implementation of the interlaced pattern. Through the type of trace arrangement (1), the signal traces (the first conductive traces) and the shielding traces (the second conductive traces) are interlaced with each other. On the other hand, for other buses or regions on the substrate, the type of trace arrangement (m) may be applied. Therefore, in the embodiments of the invention, when the conductive traces are arranged at fixed pitches, the density of the shielding traces will be different for different buses or in different regions. That is, for the buses or regions adopting the type of trace arrangement (1), the shielding traces are arranged denser than others adopting the trace arrangement (m). Therefore, for the semiconductor device 100, there may be at least two different trace arrangement patterns on the substrate (such as the patterns shown in FIGS. 4A, 4B and 4C, which will be discussed in the following paragraphs).

According to an embodiment of the invention, the shielding pattern provided by the shielding traces may be formed by a ground signal, a power signal or a random signal. For example, the shielding traces may be coupled to a ground level or a DC voltage level. In some embodiments, the shielding traces are the ground traces. Several embodiments of the arrangements of the shielding traces (which will be referred to ground traces for simplicity in the following paragraphs) and the signal traces will be described below.

Figure 4A:
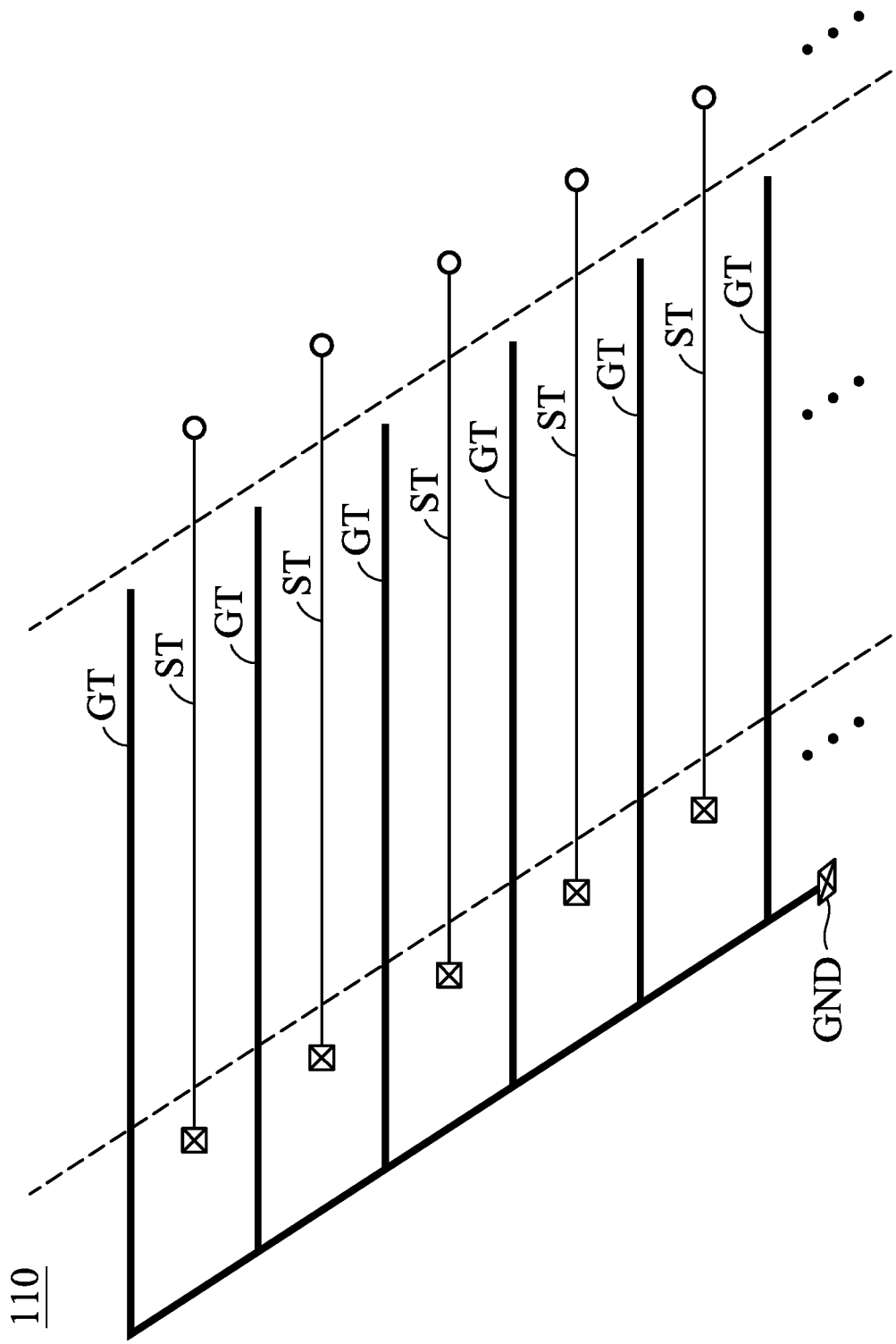
FIG. 4A is an exemplary schematic diagram showing the arrangement of a plurality of conductive traces according to an embodiment of the invention.

FIG. 4A is an exemplary schematic diagram showing the arrangement of a plurality of conductive traces according to an embodiment of the invention. The trace arrangement shown in FIG. 4A is an example of the type of trace arrangement (1). As shown in FIG. 4A, the signal traces ST and the ground traces GT are interlaced with each other to form a substantially interlaced pattern. Two adjacent signal traces ST are separated by one ground trace GT, or, each signal trace ST is placed between two ground traces GT. In this embodiment, the trace arrangement pattern may be GSGSGSG, wherein G represents the ground trace and S represents the signal trace.

In one embodiment of the invention, the arrangement shown in FIG. 4A may be configured for the signal traces utilized to transmit the data signals, such as the data bits signal DQs. That is, in one embodiment of the invention, the ground traces GT are interleaved with the signal traces utilized to transmit the data bits signal DQs. Thereby, in the embodiment, the signal traces utilized to transmit different bits of one-byte data will be separated from each other by the ground traces GT.

Note that in the embodiments of the invention, the interleaved ground traces GT may be commonly coupled to one or more ground pads, and the number of ground pads is determined based on the chip design. Therefore, the invention should not be limited thereto.

Figure 4B:
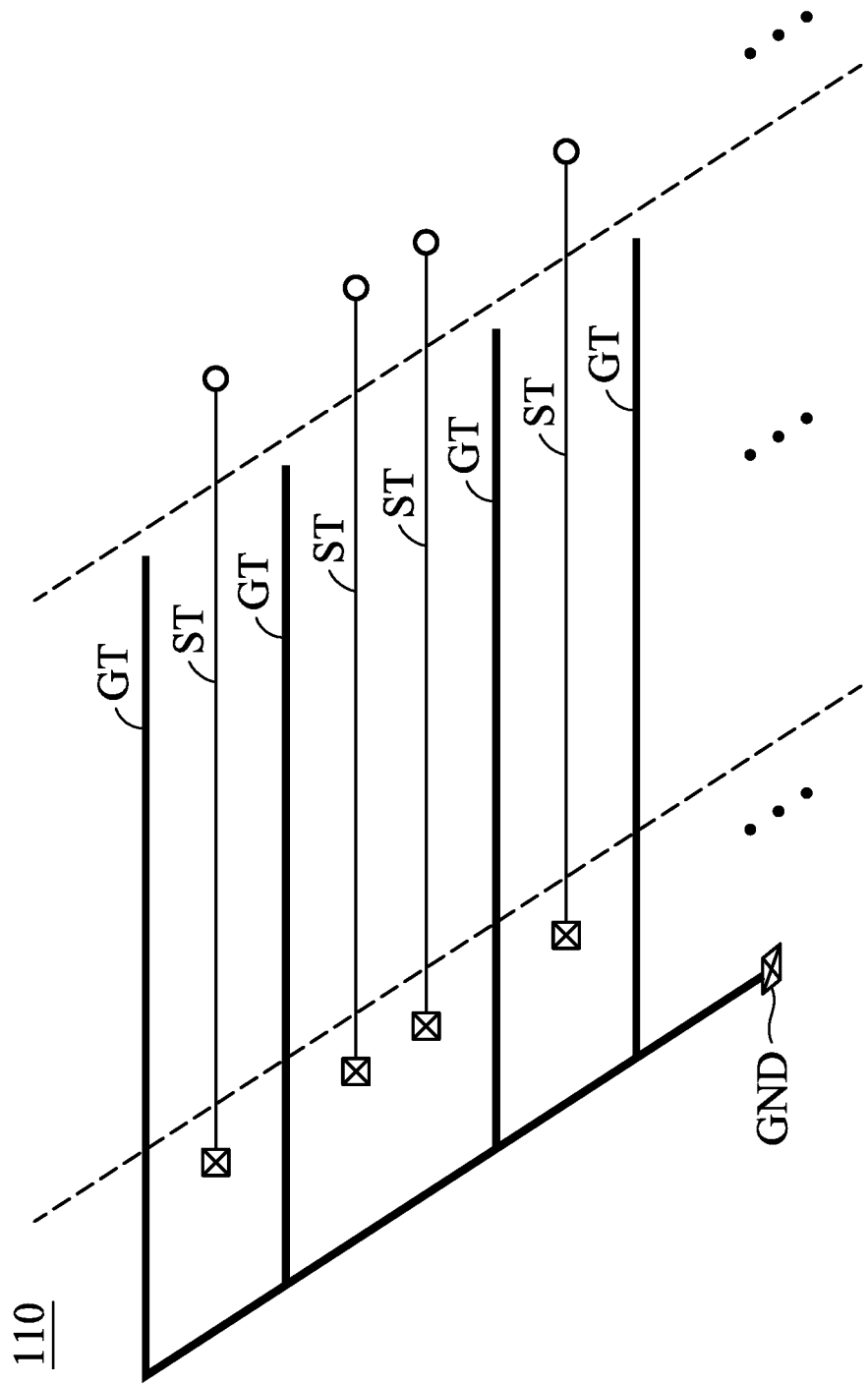
FIG. 4B is another exemplary schematic diagram showing the arrangement of a plurality of conductive traces according to another embodiment of the invention.

FIG. 4B is another exemplary schematic diagram showing the arrangement of a plurality of conductive traces according to another embodiment of the invention. The trace arrangement shown in FIG. 4B is another example of the type of trace arrangement (1), or may be regarded as a variation of the type of trace arrangement (1). As shown in FIG. 4B, the signal traces ST and the ground traces GT are interlaced with each other to form a substantially interlaced pattern. A pair of signal traces ST (the third conductive traces) is placed between two ground traces GT. For the remaining signal traces ST, two adjacent signal traces ST are separated by one ground trace GT, or, each of the remaining signal traces ST is placed between two ground traces GT. In this embodiment, the trace arrangement pattern may be GSG in combination with GSSG, wherein G represents the ground trace and S represents the signal trace.

In one embodiment of the invention, the arrangement shown in FIG. 4B may be configured for the signal traces utilized to transmit the data signals and clock signal, wherein the pair of signal traces ST without a ground trace GT disposed there between may be utilized to transmit a pair of differential clock signals, such as the clock signals DQS and DQSB discussed above. Since clock signals DQS and DQSB are a pair of differential signals, the crosstalk or coupling between these two adjacent traces is minor. Therefore, there is no significant benefit in further arranging a ground trace between the pair of signal traces ST utilized to transmit the differential clock signals. However, it should be noted that one may still use the arrangement shown in FIG. 4A to arrange a ground trace between the pair of signal traces ST utilized to transmit the differential clock signals, and the invention should not be limited thereto.

Figure 4C:
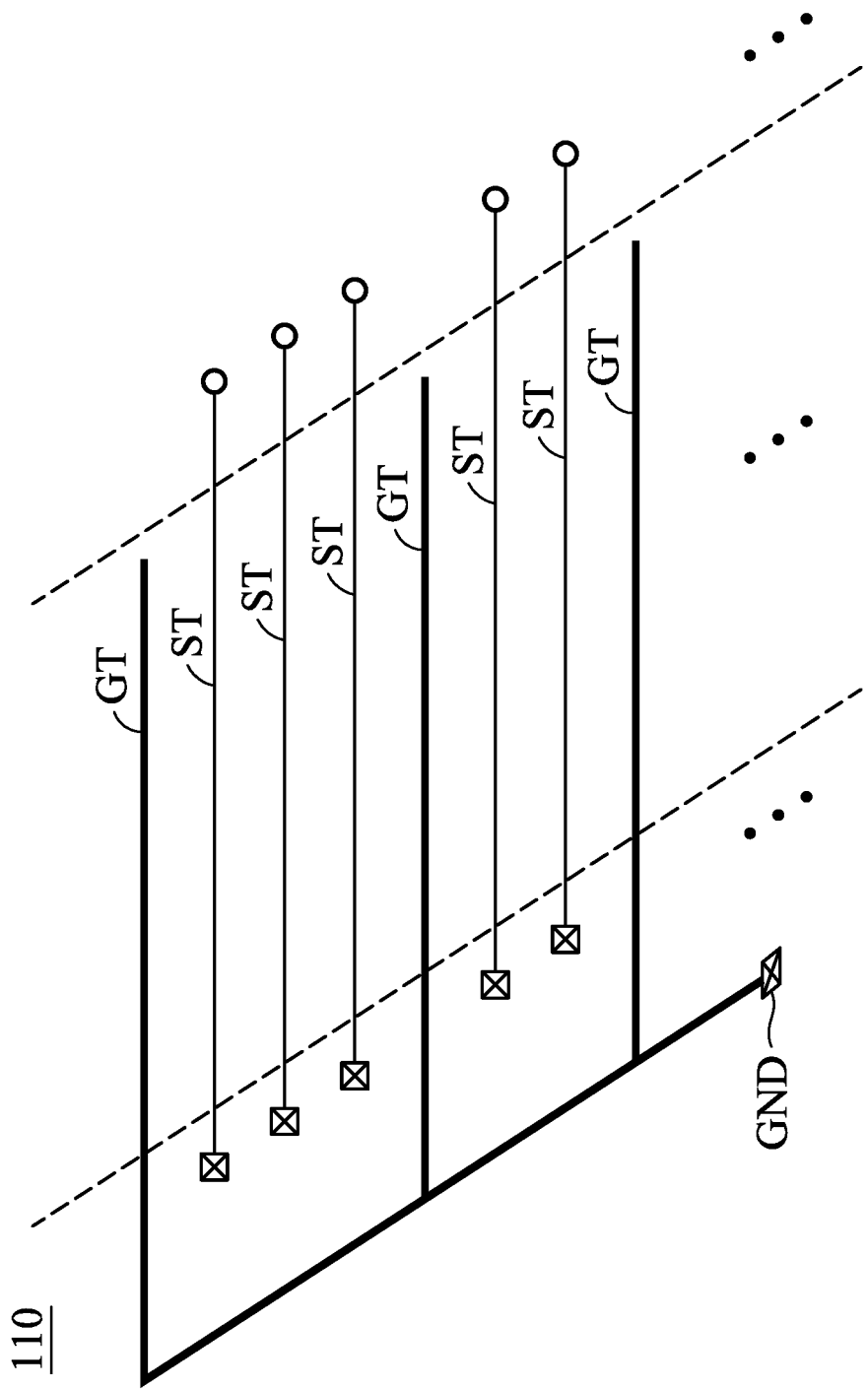
FIG. 4C is yet another exemplary schematic diagram showing the arrangement of a plurality of conductive traces according to yet another embodiment of the invention.

FIG. 4C is yet another exemplary schematic diagram showing the arrangement of a plurality of conductive traces according to yet another embodiment of the invention. The trace arrangement shown in FIG. 4C is an example of the type of trace arrangement (m). As shown in FIG. 4C, a group of signal traces ST are separated by two ground traces GT. For example, each group of signal traces ST (for example, two or three (or more than three) signal traces ST may form a group) are separated by two ground traces GT or, each ground traces GT is placed between two or three (or more than three) signal traces ST.

In one embodiment of the invention, the arrangement shown in FIG. 4C may be configured for the signal traces utilized to transmit the command signals. In this embodiment, the trace arrangement pattern may be GSSG, GSSSG, or GS . . . SG where G represents the ground trace and S represents the signal trace.

FIG. 5A is an exemplary diagram showing the layout of a portion of conductive traces of a memory interface according to an embodiment of the invention. In the embodiment, the signals transmitted on the conductive traces are also shown. The arrangement of the signals transmitted by the memory interface shown in FIG. 5A is designed for an external device having a relatively high data transmission rate, such as a LPDDR4. As shown in FIG. 5A, the signal traces utilized to transmit data bits DQs are all separated from each other by the ground traces transmitting the ground signal GND. In addition, each signal trace utilized to transmit a mask signal DQM is also placed between two ground traces. In some embodiments, the signal traces utilized to transmit data bits DQs and a mask signal DQM may further be substantially surrounded by the ground traces. The pair of signal traces utilized to transmit the differential clock signals DQS and DQSB is placed between two ground traces. In some embodiments, the pair of signal traces utilized to transmit the differential clock signal DQS and DQSB may further be substantially surrounded by the ground traces.

In this embodiment, there are 11 signal traces configured for the data bus DQ for transmitting the 11 bits of signals as discussed above, and 11 ground traces are inserted in both sides of the 11 signal traces to perform ground shielding.

Regarding the signal traces utilized to transmit the command signals CMDs, the trace arrangements (m) may be adopted. As shown in FIG. 5A, ground traces are inserted in both sides of two or three signal traces utilized to transmit the command signals CMDs. Note that in some embodiments, one ground trace may be branched out into several ground traces. As shown in FIG. 5A, the bottom ground trace extended along the horizontal direction is branched out into several ground traces extended upward along the vertical direction (the first tier ground trace), and a portion of first tier ground traces are further branched out into several ground traces extended upward along the vertical direction with some predetermined angle (the second tier ground trace).

Note further that, in some embodiments, the conductive traces are arranged at fixed pitches along the direction that is perpendicular to the direction in which the conductive traces are extended in one or more regions, such as the regions A and B shown in FIG. 5A.

FIG. 5B is an exemplary diagram showing the layout of a portion of conductive traces of a memory interface with the corresponding pad arrangement according to an embodiment of the invention. In the embodiment, the signals transmitted on the conductive traces are also shown via the corresponding pads. The arrangement of the signals transmitted by the memory interface shown in FIG. 5B is designed for an external device having a normal data transmission rate, such as a LPDDR3. As discussed above, the arrangement of the conductive traces routed on the substrate are fixed and shared by different types of external device. Therefore, the layout shown in FIG. 5A and FIG. 5B are the same, and the difference between FIG. 5A and FIG. 5B is the arrangement of the signals that are configured to be transmitted through the memory interface.

As shown in FIG. 5B, the signal traces, which are arranged based on the position of the data bus DQ for transmitting the 11 bits of signals for LPDDR4 as shown in FIG. 5A, are now configured for the command bus CMD for transmitting command signals, such as the command signals CA2, CA3, CA4, CA5, CA6, CA7, CA8 and CA9. In addition, the signal traces, which are arranged based on the position of the command bus CMD for transmitting the command signals for LPDDR4 as shown in FIG. 5A, are now configured for transmitting other command signals and clock signals, such as the command signals CA1, CS1, CA0 and CS0N and the clock signals CKE0, CKE1, CLK_C and CLK_T.

As discussed above, in the embodiments of the invention, the die 120 is capable of operating in at least a first mode and a second mode according to the type of external device coupled thereto, and the semiconductor device 100 is capable of supporting controls of access operations to at least two types of external device via the interface. The control circuitry 160 may obtain information regarding the type of external device via the indication signal INFO. According to an embodiment of the invention, when the indication signal INFO indicates that a high speed device, such as the LPDDR4, is coupled to the die 120, the control circuitry 160 may perform corresponding configuration, so as to configure the die 120 to operate in the first mode and configure the pin/pad of the memory interface based on the corresponding pin/pad arrangement of the external device. Note that besides the pin/pad configuration, the control circuitry 160 may further adjust the corresponding communication protocol and switch the firmware/software programs to be executed, accordingly, based on the type of external device.

On the other hand, when the indication signal INFO indicates that a normal speed device, such as the LPDDR3, is coupled to the die 120, the control circuitry 160 may perform corresponding configuration, so as to configure the die 120 to operate in the second mode and configure the pin/pad of the memory interface based on the corresponding pin/pad arrangement of the external device. Note that besides the pin/pad configuration, the control circuitry 160 may further adjust the corresponding communication protocol and switch the firmware/software programs to be executed, accordingly, based on the type of external device.

According to an embodiment of the invention, when the die 120 is configured to operate in the first mode, some conductive traces (such as the signal traces supposed to be utilized to transmit data signals DQs in the first mode) are configured to perform bidirectional signal transmission. On the other hand, when the die 120 is configured to operate in the second mode, some conductive traces (such as the signal traces supposed to be utilized to transmit command signals CMDs in the second mode) are configured to perform unidirectional signal transmission.

To be more specific, referring to FIG. 5A, when the die 120 is configured to operate in the first mode, at least some of the leftmost 11 signal traces configured for transmitting data signals DQs are configured to perform bidirectional signal transmission in the first mode. When the type of external device is changed and the die 120 is configured to operate in the second mode in response to this change, the leftmost 11 signal traces are configured to perform unidirectional signal transmission for transmitting command signals CMDs in the second mode. Therefore, in the embodiments of the invention, the functions of bidirectional and unidirectional signal transmission of the signal traces are configurable.

Noted that in the embodiments of the invention, besides the pair of differential clock signals, the signals transmitted on the corresponding signal traces are single-ended signals. In addition, the signals transmitted on the corresponding signal traces are all digital signals, that is, two voltage levels or two states are transmitted on the corresponding signal traces.

Figure 6:
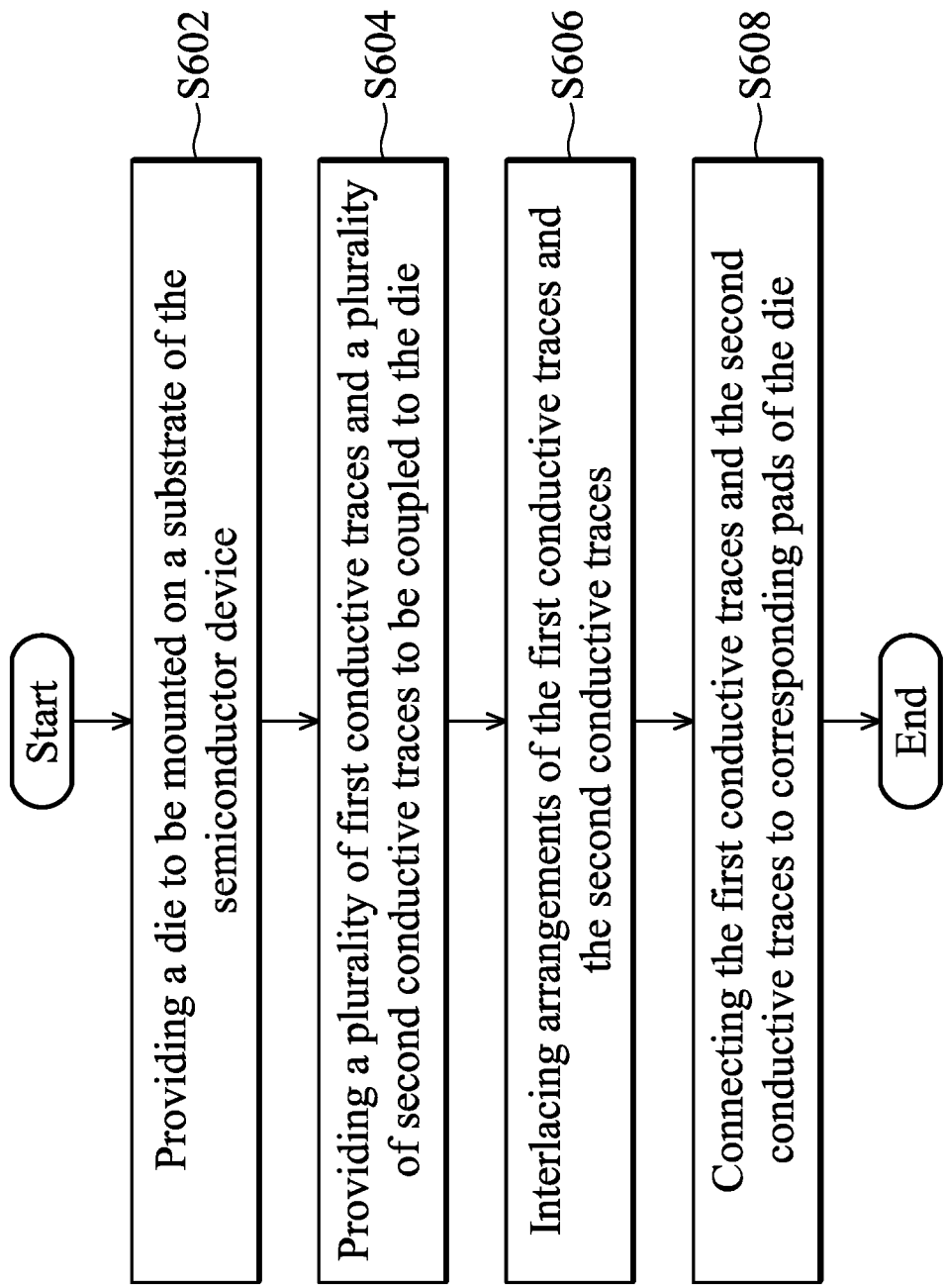
FIG. 6 is an exemplary flow chart of a method for enhancing signal integrity of an interface provided by a semiconductor device according to an embodiment of the invention.

FIG. 6 is an exemplary flow chart of a method for enhancing signal integrity of an interface provided by a semiconductor device according to an embodiment of the invention. According to an embodiment of the invention, the interface may be a memory interface and the semiconductor device may be provided as a memory controller chip capable of supporting controls of access operations to at least two types of external device via the interface. First of all, a die to be mounted on a substrate of the semiconductor device is provided (Step S602). According to an embodiment of the invention, the die is capable of operating in at least a first mode and a second mode according to the type of external device. Next, a plurality of first conductive traces and a plurality of second conductive traces to be coupled to the die are provided (Step S604). According to an embodiment of the invention, the second conductive traces will be coupled to a predetermined voltage for providing a shielding pattern. Next, arrangements of the first conductive traces and the second conductive traces are interlaced (Step S606). According to an embodiment of the invention, the first conductive traces and the second conductive traces are interlaced with each other as several embodiments illustrated above. Next, the first conductive traces and the second conductive traces are connected to corresponding pads of the die when they are routed on the substrate (Step S608).

According to an embodiment of the invention, the method may further comprise providing a plurality of third conductive traces to be coupled to the die; interlacing arrangements of the third conductive traces and the second conductive traces, wherein the third conductive traces are placed between two second conductive traces; and connecting the third conductive traces to corresponding pads of the die when they are routed on the substrate.

As discussed above, the semiconductor device 100 may have different trace arrangement patterns on the substrate, including GSGSGSG, GSG in combination with GSSG, GSSG, GSSSG, or GS . . . SG, wherein G represents the ground trace and S represents the signal trace. For the trace arrangement pattern in which the ground traces are arranged in the densest manner, ground traces are placed in both sides of each signal trace to perform ground shielding.

In addition, regarding the operation mode configuration of the die, according to an embodiment of the invention, the method may further comprise: detecting the type of external device coupled to the die to determine whether to configure the die to operate in the first mode or the second mode; and configuring the first conductive traces to perform bidirectional signal transmission when the die is configured to operate in the first mode and configuring the first conductive traces to perform unidirectional signal transmission when the die is configured to operate in the second mode.

According to another embodiment of the invention, the method may further comprise: detecting the type of external device coupled to the die to determine whether to configure the die to operate in the first mode or the second mode; and configuring the first conductive traces to transmit data signals when the die is configured to operate in the first mode and configuring the first conductive traces to transmit command signals when the die is configured to operate in the second mode.

Through the proposed trace arrangements, transmission performance and signal integrity of the data signals transmitted at a high data transmission rate can be enhanced and improved. In addition, since the proposed semiconductor device is a combo design capable of supporting different types of external device, forward and backward compatibility of the semiconductor device between different generations of external devices can also be achieved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A semiconductor device, comprising:
   a substrate;
   a die, mounted on the substrate; and
   a plurality of conductive traces, routed on the substrate and connected to the die,
   wherein the plurality of conductive traces at least comprise a plurality of first conductive traces and a plurality of second conductive traces, the plurality of second conductive traces being coupled to a predetermined voltage for providing a shielding pattern,
   wherein the plurality of first conductive traces and the plurality of second conductive traces are disposed on the substrate in an at least partially interlaced pattern,
   wherein the plurality of conductive traces are configured to provide an interface for interfacing with an external device which is configured in an exterior of the semiconductor device and the die is a controller device for controlling access to the external device, and wherein the die detects a type of the external device coupled to the die to determine whether to operate in a first mode or a second mode, configures the plurality of first conductive traces to perform bidirectional signal transmission when the die is configured to operate in the first mode and configures the plurality of first conductive traces to perform unidirectional signal transmission when the die is configured to operate in the second mode,
   wherein the plurality of second conductive traces are coupled to a predetermined voltage for providing a shielding pattern when the die is configured to operate in the first mode and the second mode.

2. The semiconductor device as claimed in claim 1, wherein the predetermined voltage is a ground voltage.

3. The semiconductor device as claimed in claim 1, wherein two adjacent first conductive traces are separated by one second conductive trace.

4. The semiconductor device as claimed in claim 1, wherein each first conductive trace is placed between two second conductive traces.

5. The semiconductor device as claimed in claim 1, wherein the plurality of first conductive traces are signal traces configured to transmit data signals and the plurality of second conductive traces are ground traces configured to transmit a ground signal.

6. The semiconductor device as claimed in claim 1, wherein the plurality of conductive traces further comprises a plurality of third conductive traces, and wherein respective traces of the plurality of third conductive traces are placed between two of the plurality of second conductive traces.

7. The semiconductor device as claimed in claim 6, wherein the plurality of third conductive traces are a pair of signal traces configured to transmit clock signals.

8. The semiconductor device as claimed in claim 1, wherein the first and second conductive traces are arranged at fixed pitches.

9. The semiconductor device as claimed in claim 1, wherein when the die is configured to operate in the first mode, the plurality of first conductive traces are configured to transmit data signals, and when the die is configured to operate in the second mode, the plurality of first conductive traces are configured to transmit command signals.

10. A method for enhancing signal integrity of an interface provided by a semiconductor device, wherein the semiconductor device is capable of controlling access operations of accessing to at least two types of external devices via the interface, wherein an external device is configured in an exterior of the semiconductor device, and the method comprises:
providing a die on a substrate of the semiconductor device, wherein the die is capable of detecting a type of the external device coupled to the die to determine whether to operate in a first mode or a second mode, configuring a plurality of first conductive traces to perform bidirectional signal transmission when the die is configured to operate in the first mode and configuring the plurality of first conductive traces to perform unidirectional signal transmission when the die is configured to operate in the second mode;
providing a plurality of second conductive traces to be coupled to the die, wherein the plurality of second conductive traces are coupled to a predetermined voltage for providing a shielding pattern when the die is configured to operate in the first mode and the second mode;
interlacing arrangements of the plurality of first conductive traces and the plurality of second conductive traces, wherein the plurality of first conductive traces and the plurality of second conductive traces are at least partially interlaced with each other; and
coupling the plurality of first conductive traces and the plurality of second conductive traces to corresponding pads of the die.

11. The method as claimed in claim 10, wherein the predetermined voltage is a ground voltage.

12. The method as claimed in claim 10, wherein each first conductive trace is placed between two second conductive traces.

13. The method as claimed in claim 10, wherein the plurality of first conductive traces are signal traces configured to transmit data signals and the plurality of second conductive traces are ground traces configured to transmit a ground signal.

14. The method as claimed in claim 10, further comprising:
providing a plurality of third conductive traces;
interlacing arrangements of the plurality of third conductive traces and the plurality of second conductive traces, wherein respective traces of the plurality of third conductive traces are placed between two of the plurality of second conductive traces; and
coupling the plurality of third conductive traces to corresponding pads of the die.

15. The method as claimed in claim 14, wherein the plurality of third conductive traces are a pair of signal traces configured to transmit clock signals.

16. The method as claimed in claim 14, wherein the plurality of first conductive traces, the plurality of second conductive traces and the plurality of third conductive traces are arranged at fixed pitches.

17. The method as claimed in claim 10, further comprising:
configuring the plurality of first conductive traces to transmit data signals when the die is configured to operate in the first mode and configuring the plurality of first conductive traces to transmit command signals when the die is configured to operate in the second mode.

18. A semiconductor device, comprising:
a substrate;
a die, mounted on the substrate; and
a plurality of conductive traces, routed on the substrate and connected to the die, wherein the plurality of conductive traces are configured to provide an interface for interfacing with an external device which is configured in an exterior of the semiconductor device and the die is capable of detecting a type of the external device coupled to the die to determine whether to operate in a first mode or a second mode, and wherein the plurality of conductive traces at least comprise a plurality of first conductive traces and a plurality of second conductive traces,
wherein when the die is configured to operate in the first mode, the plurality of first conductive traces are configured to perform bidirectional signal transmission, and when the die is configured to operate in the second mode, the plurality of first conductive traces are configured to perform unidirectional signal transmission, and
wherein the plurality of second conductive traces are coupled to a predetermined voltage for providing a shielding pattern when the die is configured to operate in the first mode and the second mode.

* * * * *